United States Patent [19]
Moussie

[11] 3,976,983
[45] Aug. 24, 1976

[54] BIPOLAR PROGRAMMABLE READ ONLY MEMORY WITH FUSIBLE LINKS

[75] Inventor: Michel Moussie, Caen, France

[73] Assignee: U.S. Philips Corporation, New York, N.Y.

[22] Filed: Feb. 11, 1975

[21] Appl. No.: 549,065

[30] Foreign Application Priority Data
Feb. 15, 1974 France .............................. 74.05137
Oct. 25, 1974 France .............................. 74.35842
Oct. 31, 1974 France .............................. 74.36453

[52] U.S. Cl. ............................................ 340/173 SP
[51] Int. Cl.² ........................................... G11C 17/00
[58] Field of Search .................. 340/173 SP; 357/51

[56] References Cited
UNITED STATES PATENTS

| | | | |
|---|---|---|---|
| 3,525,083 | 8/1970 | Slob et al. ........................ | 340/173 SP |
| 3,611,319 | 10/1971 | Hyatt ............................. | 340/173 SP |
| 3,721,964 | 3/1973 | Barrett et al. ................. | 340/173 SP |
| 3,872,450 | 3/1975 | Reynolds ....................... | 340/173 SP |

Primary Examiner—Stuart N. Hecker
Attorney, Agent, or Firm—Frank R. Trifari; Daniel R. McGlynn

[57] ABSTRACT

A read-only memory which can be programmed by means of internal fuses and whose memory cells are formed by bipolar transistors in an ECL circuit.

The emitters of the memory-position transistors are coupled to the emitter in a row-address transistor, the bases are connected directly to the emitter of a column read transistor, the collector lines include the fuses, and the rows and columns are supplied from current sources.

8 Claims, 6 Drawing Figures

BIPOLAR PROGRAMMABLE READ ONLY MEMORY WITH FUSIBLE LINKS

The invention relates to a read-only memory (ROM) which is programmable with the aid of fuses and which includes at least one XY-matrix of memory positions which are arranged in rows and columns, of which each row and each column of memory positions is driven by a transistor, each memory position being constituted by a bipolar transistor and a fuse which is connected in series with one of the transistor electrodes.

Such memories or P-ROMS constitute an important element in the field of logic circuits. At the intersections of the conductors memory positions are located which are each formed by a unidirectional element whose impedance can assume two different values, such as a transistor whose base is connected to an X-conductor and whose emitter is connected to a Y-conductor. Some memories of this type are programmable by the user, means being provided for writing specific binary information into each memory position in a definitive manner, even after the memory has been manufactured and encapsulated. The means which is used for writing in said information is for example a fuse, whose interruption at the desired positions is externally controlled, which operation is called the programming of the memory.

Such memories may be integrated into a logic-circuit arrangement and may be adapted both to the address decoding devices and to the read devices.

Logic circuits with coupled emitters, generally called ECL-circuits (Emitter Coupled Logic), can be realized by means of a known techniques. Compared with conventional circuits, ECL circuits are substantially faster. However, the programable high-capacity read-only memories known to date are incompatible with the logic circuits of the ECL type, unless suitable logic circuits are provided at the input and at the output of the memory. However, when said memory does not have the same speed characteristics as ECL-circuits it will slow down the operation of the complete arrangement.

Hence, a programmable high-capacity read-only memory is required which can be adapted to logic circuits of the ECL type, the memory being based on the same structural principles as said ECL circuits and retaining all the advantages of said type of circuits.

It is in particular an object of the invention to solve this problem and to provide a programmable read-only memory which is compatible with coupled-emitter logic circuits of the ECL-type.

One of the objects of the invention is to provide a programmable read-only memory which is based on the ECL-technique and which, in accordance with said technique has a higher speed because the transistors are not used in the saturated condition and the logic voltage swings are small.

The memories take the form of XY-matrices, i.e. the memory cells or positions are arranged in rows and columns.

The memory according to the invention provides the emitters of the memory position transistors of a row be connected directly to a row conductor which is supplied with a constant current and which is connected to a row address device, while the bases of the memory position transistors of a column are connected directly to a column conductor, also connected to a constant current source, and to a read element, each of the collectors of the memory position transistors being connected to a voltage source via a through fuse, and each of the read elements being connected directly to means for detecting differences in current level.

The fuses of the memory are not included in the connection between the rows and the columns, as in most of the known fusible link memories. A fuse breakdown, however, results in a change in impedance of the connections. Since a generator supplies a constant current to a row, the base current of an addressed memory position transistor will substantially equal the current which is injected into the emitter when the fuse is interrupted, and is reduced to the ratio x $1/\beta + 1$, $\beta$ being the current gain factor of the memory position transistor when the fuse is not interrupted. It suffices when the gain of the memory position transistor is greater than 1 to obtain a substantial impedance difference when the fuse is interrupted or intact. When the memory-position transistor is addressed it operates beyond the saturation range if the fuse is not interrupted, and it operates in the saturation range with the collector current being zero if the fuse is interrupted.

The collector current of a read transistor is supplied by the current source of the corresponding column and to said current the base current of a memory position transistor is added. Thus, a current-level detecting means receives a sum of two currents, of which one current may have either of two values depending on whether the fuse of the relevant memory position is interrupted or intact. No resistance is added in the emitter connections of the various transistors of the memory.

Thus, an address transistor and each of the memory position transistors of the row driven by said address transistor are connected as a differential pair, with their emitters coupled in accordance with the ECL technique, and the current from the row generator is applied to the address transistor when the row is not addressed.

Consequently, the memory according to the invention is compatible with coupled emitter logic circuits of the ECL-type is an application of said technique. Owing to the emitters of the address transistor and of the memory position transistors being coupled to a well-defined current is switched which can be attained with small voltage differences.

Read-out is effected by detection of current levels. The read and address transistors can be operated in a non-saturated region of their characteristic, whilst a memory position transistor whose fuse is interrupted after it has been addressed can more rapidly assume an unsaturated state owing to the absence of an resistance element. By a appropriate choice of the voltage and current levels it is thus possible to obtain access and read times of the order of the propagation delay times of the signals in coupled emitter logic circuits.

It is advantageous when the current which is supplied by the current sources of the columns is comparatively large, in order to reduce the charge-elimination time in the memory position transistor and also in order to reduce the discharge times of the stray capacitances, i.e. those of the column conductors. Said current, however, has been proportioned so as to ensure that after addition of said current to the base current of the addressed memory position transistor the read transistor is not saturated.

Read-only memories which are programmable with fuses are known in which a memory position is read by measuring a current which may have two distinct values in accordance with the condition of the fuse. This is for example the case with the memory described in the Journal "IEEE Journal of Solid State Circuits," Volume SC 5, No. 5, pages 196 to 202, issued in October 1970. However, in said memories the fuses are disposed in the emitter leads. A resistor is connected in series with an emitter of a memory-position transistor and thus increases the response time. Reading is effected by detecting the presence or absence of current in a read transistor. The voltage excursion of the read and address signals must be substantial. Moreover, such a memory is incompatible with the logic circuits of the coupled-emitter type.

When the transistors take the form of an integrated circuit of the planar type in a plate which serves as a substrate, allowance must be made for the parasitic transistors which are constituted by the bases and collectors of the integrated transistors and the substrate. In the memory according to the invention the gain of the parasitic transistor of each memory position is non-critical and has little influence on the read signal. The collector current of said parasitic transistors only has an effect when the fuse is interrupted. Said collector current merely causes an increase in the difference between the read current in the case of an interrupted fuse and the read current in the case of a non-interrupted fuse.

The gain of said parasitic transistor need not be high and may even be substantially zero.

In a preferred embodiment a reference voltage transistor is connected as a differential pair with each read transistor. The emitter of said reference transistor is connected directly to the column conductor, whilst the base of said transistor is connected to a constant-voltage source. The constant voltage which is applied to the base of the reference transistor is selected to be intermediate between the voltage levels which are applied to the bases of the read transistors. Said differential pair arrangement enables the read current to be fed either to the read transistor or to the reference transistor in accordance with the level of the column-address voltage. The read and reference transistors can be operated in a non-saturated region with reduced switching times. On the other hand, said two transistors give rise to a voltage at the bases of the memory-position transistors of their column. The levels of the voltages which are applied to the bases of the read and reference transistors are such that the base voltage obtained at the memory position transistors of the relevant column turns on the memory position transistor of said column which is located at an addressed row, and turns off the memory-position transistors of that same column which are located at the non-addressed rows.

In an improved embodiment a voltage limiting transistor is arranged as a differential pair with each row-address transistor and the memory position transistors of the row. The emitter of the limiting transistor is connected directly to the row conductor, its base being connected to a source of constant voltage. The constant voltage which is applied to the bases of the limiting transistors is selected to be intermedite between the voltage levels applied to the bases of the memory-position transistors and obtained from the read transistor or from the reference transistor, depending on whether or not the column is addressed. Thus, the differential arrangement allows the memory-position transistors of an addressed line which are located at the non-addressed columns to be kept turned off. On the other hand, the constant voltage which is applied to the bases of the limiting transistor is selected to be intermediate between the voltage levels which are applied to the bases of the address transistors, so as not to counteract the effect of the address signals.

When information is written in a memory position which corresponds to a circuit with interrupted collector fuse, a current is fed into the fuse of the collector of the memory-position transistor which causes said fuse to melt locally. The current is obtained by means of a programming current generator, which supplies its current to the row of the addressed transistor in parallel with the row current generator. Alternatively, the row current generator may be designed so that it supplies either a large current for programming, or a small current for reading purposes.

Simultaneously with the melting current pulse, the voltage which is supplied by the source to which the collectors of the memory position transistors are connected, it is increased so as to compensate for the larger voltage drop in the fuse owing to the increased current, and so as to prevent the memory-position transistor from being saturated. Upon interruption of the fuse the voltage at the row of the relevant memory-position transistor decreases, and the current supplied by the current generator is fed into the limiting transistor, instead of the other memory position transistors of the same row.

It is obvious that in the memory according to the invention the columns may be arranged in identical groups. The collectors of the read transistors which drive the columns of a group are connected to each other and to a read device associated with said group. For addressing a column within a group a decoding device is provided, which device is connected to the bases of the read transistors.

By means of a fuse, each of the collectors of the memory-position transistors of the same group is connected to a common point of fixed voltage, which may assume two different values, so that the memory has a common point for each group of columns.

Reading is effected by measuring the value of a current. The measurement can be effected advantageously by passing the collector current of the read transistors through a resistor which is included between the collectors and ground, a voltage detection device being connected to the terminals of the resistor.

Preferably, the transistors of the memory are npn transistors, the supply voltages from which the voltage levels of the address and reference signals are derived being negative. When the transistors of the memory arrangement are realized in a monolithic semiconductor, the substrate is brought to the most negative potential, the ground terminals then carrying the least negative potential.

The memory according to the invention can be realized in a silicon wafer in accordance with conventional integrated-circuit and micro-circuit manufacturing techniques. It is advantageous when apart from the XY-matrix, the devices which are necessary for the operation of the memory are also integrated on the same chip, such as: the row and column current generator, the programming current generators, the voltage generators which supply the common points to which the fuses of the collectors of the memory position transistors are connected, the read devices, the address decoding devices, the reference voltage generators, the programming control devices, and the interface devices which may be required to connect the memory to external circuitry.

It is advantageous if the fuses are made of thin layers of nickel-chromium in accordance with known techniques for manufacturing read-only memories with fuses.

Preferably, the transistors of the arrangement, specifically the memory cell transistors, are transistors of the planar type which are obtained by epitaxial deposition and diffusion, lateral isolation between the various regions being provided by a oxide, for example silicon oxide.

The transistors of the memory may alternatively be realized by means of other known techniques.

Preferably, the emitters of the transistors of the memory, and in particular of the memory position transistors, are emitters whose contact-opening is obtained by removing a thin layer of oxide to expose the diffusion windows without photo-etching, so that more narrow emitters and a gain of speed can be obtained.

Several memories according to the invention may be combined to constitute high-capacity memories. A device for selecting one memory from a combination of memories is then added to the address device.

The present invention also relates to the method operating a programmable read-only memory of the above type. This method comprises a programming operation by means of which information is written into the memory, and a read operation. The method operating a programmable read-only memory provides a memory position is addressed by a change of the voltage of a row-address transistor from a high level to a low level, and by a change of the voltage at the base of a read transistor from a low level to a high level, that the reference voltage at the bases of the column reference transistor is fixed between the high and low levels of the voltages at the bases of the read transistors, and that the reference voltage at the bases of the limiting transistors is fixed between the high and low levels of the voltages at the bases of the memory-position transistors. The method is futhermore characterized in that, in accordance with the program to be written into the memory, the fuses of the desired memory-position transistors are interrupted by addressing the memory-position transistor and by causing a current generator which is connected to each row to supply a current pulse of sufficient value which by its passage through the relevant transistor causes the fuse which is connected to the output of its collector to melt, while the common output point of the fuses of the relevant group is simultaneously brought at a high voltage, and the common output points of the fuses of the non-relevant groups are maintained at a voltage which is so low that the resistance of the fuses would limit possible currents in the fuses to a value which will not effect the conditions of such fuses.

According to the above method the read operation provides that information stored in the memory is read by addressing at least one memory-position transistor, the common point being maintained at a low voltage, and the collector-current level of the read transistor of the relevant column being detected, while the voltage levels, the voltage swings, and the currents being selected so that the read and address transistors, the limiting and reference transistors, and the memory-position transistors whose fuses are intact are not saturated at any instant.

Suitably, the mutual difference between the various voltage levels averages 0.2 V, the address voltage swings and the voltage swings at the input and at the output of the memory being approximately 0.8 V, corresponding to the voltage swings which are usual in logic circuits of the ECL type.

Programming of the memory, i.e. writing in binary information by interrupting fuses at selected positions, requires a large current in the collectors of the relevant memory-position transistors.

It is advantageous when the current which is fed into a row for interrupting a fuse equals 20 times the current which is fed into the row for reading the information. The latter current is of the same order of magnitude as the current supplied by a column current generator for reading information or for programming.

Such a large current is only applied during writing and is exclusively applied to the relevant memory-position transistors.

The invention may be used in any logic circuit arrangement, in particular when the other elements of the logic circuit arrangement have high response speeds of the order of nanoseconds.

The invention will now be described with reference to the accompanying drawings.

Figure 1:
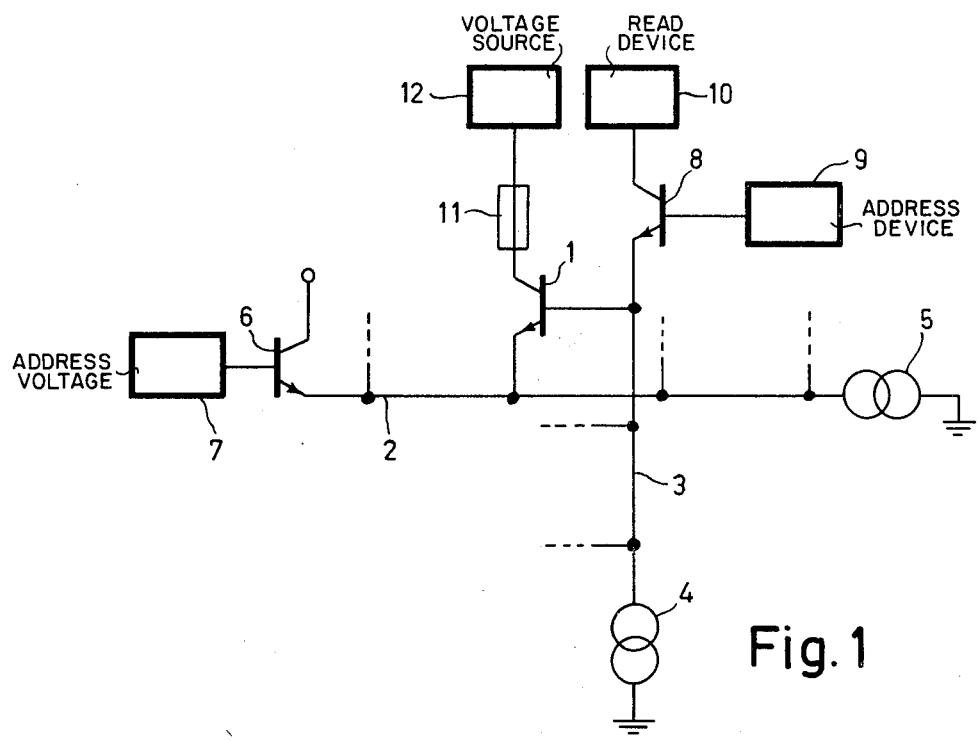
FIG. 1 is a circuit diagram of a memory according to the invention and in particularly relates to an arbitrarily selected memory position.

In FIG. 1 the reference numeral 1 denotes a memory position transistor 1 of a matrix with X × Y identical transistors. The emitter of said transistor 1 is connected to a row conductor 2 to which the emitters of other memory position transistors are connected. The base of transistor 1 is connected to a column conductor 3, while via a fuse 11 the base of said transistor 1 is connected to a voltage source 12 which can supply two different voltage levels.

The row conductor 2 is fed by a generator 5 which can supply currents of two different values. The base of an address transistor 6 receives address voltages from a device 7, while the emitter of said transistor 6 is connected to the row conductor 2.

The column conductor 3 is fed by a current generator 4. The base of an address transistor 8 receives address voltages from a device 9, the emitter of said transistor 8 is connected to a column conductor 3, and the collector of the transistor is connected to a read device 10.

The memory is programmed by turning on the memory-position transistor and by causing the generator 5 to supply a current whose value suffices to interrupt the fuse when the memory position should correspond to the information with melted fuse.

The memory is read by turning on the memory position transistor 1 and the transistor 8 and by turning off the transistor 6 by means of address voltages which are applied to the bases of transistors 6 and 8. When the fuse is interrupted, the read device 10 receives a current which equals the sum of the currents supplied by the generators 4 and 5. When the fuse is intact, the read device 10 receives a current which equals the sum of the current supplied by the generator 4 and the base current of the transistor 1, which is substantially equal to the current supplied by the generator 5 divided by the gain factor $\beta$ of the memory position transistor.

The memory includes means to ensure that the transistor 1 is turned on only when the row and the column to which said transistor is connected are addressed. The transistor 1 is turned off when the line or the column to which said transistor is connected is not addressed.

Figure 2:
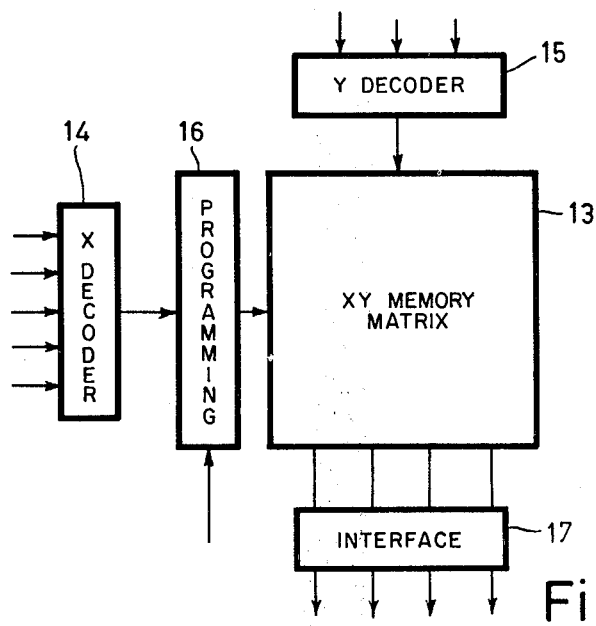
FIG. 2 is the block diagram of a memory according to the invention.
Figure 3:
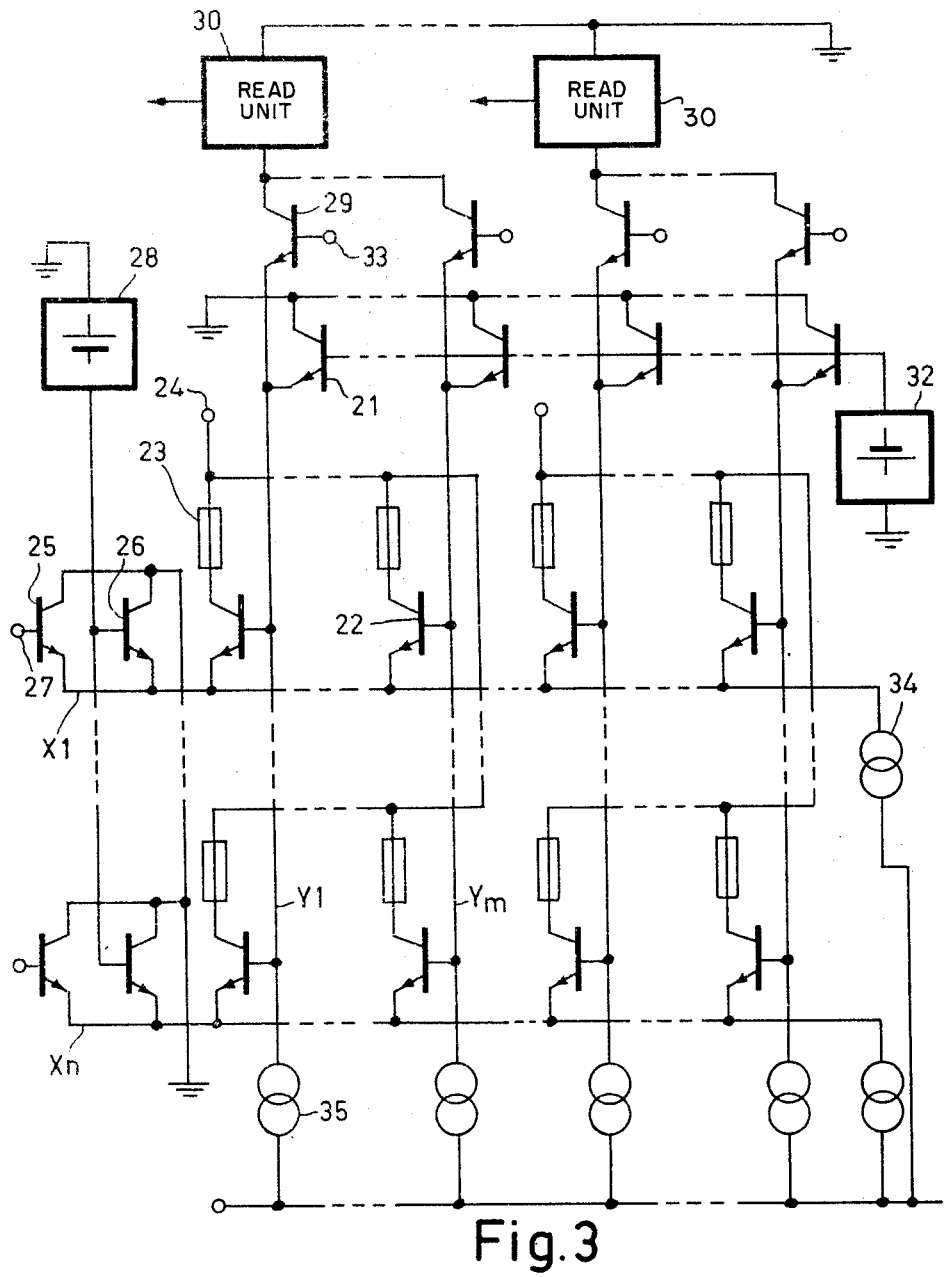
FIG. 3 shows another circuit diagram of a memory device according to the invention.

These means are explained by means of FIG. 3 and the following description. The diagram and description relate to a memory whose block diagram is shown in FIG. 2. The memory is accommodated in a semiconductor substrate and is enclosed in a casing. The memory arrangement comprises: an XY memory-position matrix 13, and X-decoding device 14, a Y-decoding device 15, a programming device 16, and an interface device 17 at which the output signals are available.

FIG. 3 shows the XY-matrix which comprises memory-position transistors 22, which are arranged in accordance with rows and columns, so as to form an XY-memory structure. The columns are combined in groups.

The shown arrangement for example constitutes a memory whose capacity is N words of K bits. The N words are divided among n rows, each bit belonging to a group of N/n m columns, The emitters of the transistors 22 of the same row are connected directly to a row conductor X to which the emitters are connected of an address transistor 25 and a voltage limiting transistor 26. Each row is supplied by a generator 34 which can supply two currents of different value. The collectors of the transistors 25 and 26 are connected to ground. The base of each address transistor 25 is connected to an output 27 of an address decoding device, not shown. The bases of the limiting transistors are connected to a constant voltage generator 28. The row circuit thus formed is repeated n times.

The bases of the transistors 22 of the same column are connected directly to a column conductor Y to which the emitter of a read transistor 29 and the emitter of a reference voltage transistor 21 are connected. The column is supplied by a constant-current generator 5. The collectors of the transistors 21 are connected to ground, while the collectors of the read transistors 29 of the same group of m columns are connected to the read device 30. The bases of the transistors 21 are connected to a constant-voltage generator 32. The base of each read transistor 29 is connected to an output 33 of an address decoding device, not shown. The column circuit is repeated m times for each group of columns.

A fuse or fusable link 23 is connected in series with each collector of a memory position transistor 22. The fuses of the collectors of the memory-position transistors of the same group of columns are connected to a point 24, which receives either a high voltage for writing information, or a low voltage for reading information. The memory is programmed by addressing the memory-position transistor whose fuse is to be interrupted, and by causing the generator 34 to supply a large current and by bringing the voltage which is applied to point 24 of the relevant group of columns at a sufficiently high level, taking into account the voltage drop across the resistence generated by the fuse.

The information in the memory is read by bringing the voltage applied to the point 24 to its low level and by addressing the various memory positions by means of the X and Y decoding devices.

In the preferred embodiment of a P-ROM in accordance with FIG. 3, in which all transistors are npn transistors which are integrated in a silicon substrate, voltages are applied whih have approximately the following values, which are thus compatible with the inputs and ouputs of logic circuits of the ECL-type. The high level of the address signals which are applied to the bases of the transistor 25 is $-1.4$ V, whilst the low level is $-2.2$ V. The high level of the address signals which are applied to the bases of transistors 29 is $-0.8$ V, and the low level is $-1.6$ V. The voltage supplied by the generator 28 is $-1.8$ V and the voltage supplied by the generator 32 is $-1.2$ V. The voltage applied to the points 24 is $-1.6$ V and this voltage is raised to $+5$ V at each of the required positions 24, whilst the substrate in which the transistors are integrated is brought at the most negative potential, i.e. $-5.2$ V, which corresponds to the potential of the positive terminal of the current generators.

A memory position is addressed by bringing point 27 of the corresponding row at the low level and by bringing point 33 of the corresponding column at high level. In said situation, the transistors 25 and 26 of the relevant row are cut off, the relevant memory position transistor is turned on, the transistor 21 of the relevant column is cut off, while the read transistor is turned on and receives the current from the generator 35 plus the base current of the memory-position transistor. The other memory-position transistors of the same row or the same column are not conductive. For a memory-position transistor which is located at an addressed row and a non-addressed column the base voltage caused by the transistor 21 equals $-2$ V, while the base voltage of the limiting transistor 26 of the row equals $-1.8$ V, the non-addressed transistor of that same row remaining cut off. On the other hand, for a memory position transistor which is located at an addressed column and a non-addressed row, the base voltage supplied by the transistor 29 equals $-1.6$ V, while the base voltage of the addressed transistor 25 of the row is $-1.4$ V, the non-addressed transistor of the addressed column remaining cut off.

When the fuse 23 of an addressed memory-position transistor is intact, the base current of said transistor equals $I/\beta + 1$, in which I is the current supplied to said transistor by the generator 34, while $\beta$ is the current gain of said transistor. When the fuse 23 of a memory position transistor is interrupted, the base current of said transistors is substantially I. The collector current of the read transistors of the addressed columns thus assumes two values which differ by $I- I/\beta + 1$, which difference can be detected by the device 30.

For programming the transistor whose fuse is to be interrupted is addressed. The current supplied by the current generator 34 of the relevant row is brought to a value between 10 mA and 100 mA during a time interval of the order of a millisecond, the resistance of the fuse being some hundreds of ohms. Simultaneously, the bit position 23 of the relevant group is brought to a positive voltage of approximately 5 V. Current pulse control is applied for row address. Additional control by raising the voltage level of a group of columns may be applied to the outputs via interface devices.

Figure 4:
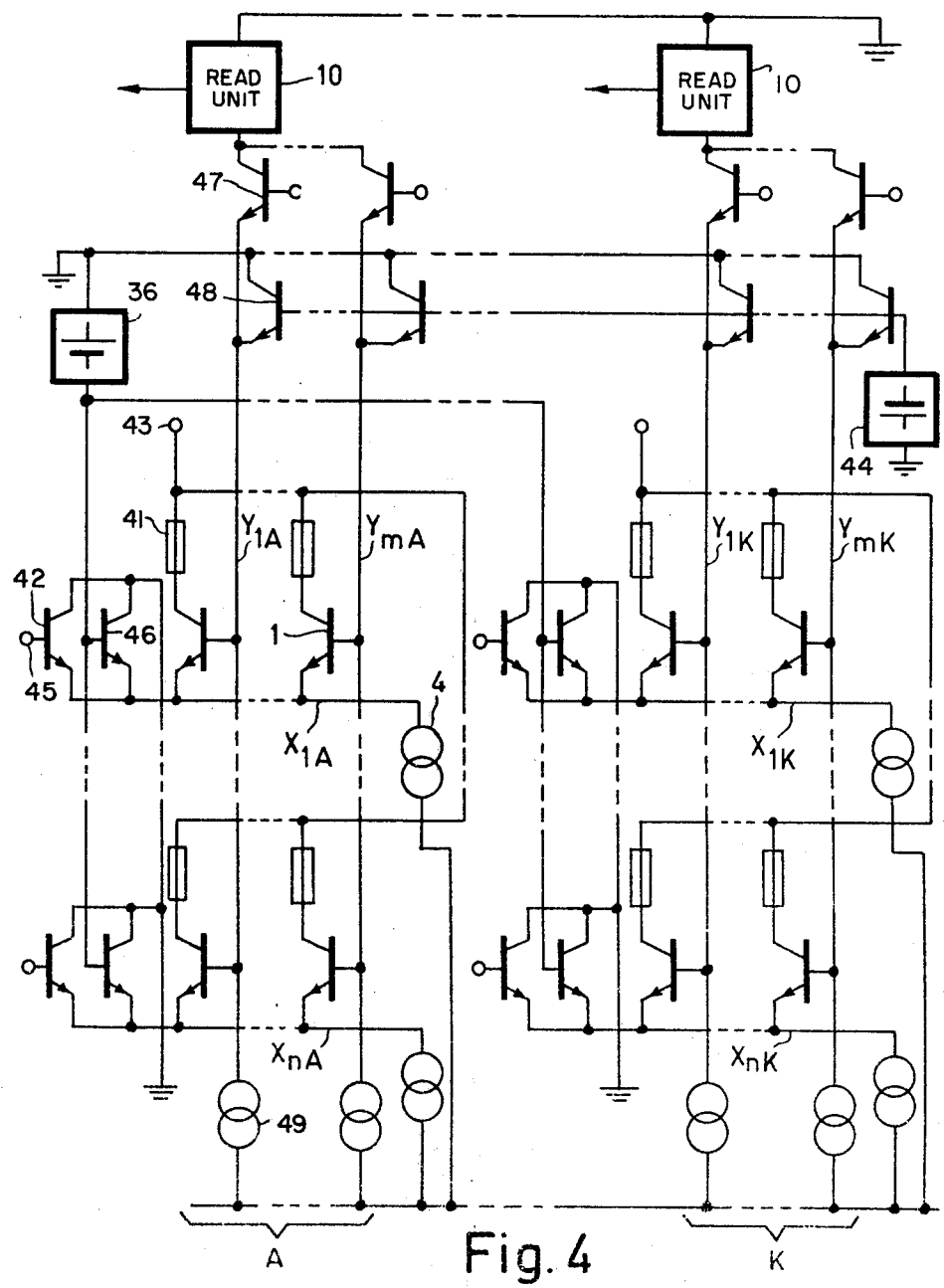
FIG. 4 shows a different embodiment of a memory according to the invention.

The read-only memory of FIG. 4 comprises memory position transistors 1, which are accommodated between the rows and columns of the X-Y matrix. The columns are arranged in groups, two of the groups being shown in the drawing. The memory has a capacity of N words and K bits. The N words are divided among n lines, each bit belonging to a group of N/n = m columns. The emitter of the transistor 1 of the same row section are connected to a row conductor section $X_{1a}$ to $X_{na}$ in the group A, $X_{1k}$ to $X_{nk}$ in the group K. To each row section the emitters of voltage limiting transistors 46 are connected. Each row section is supplied from a current source 4 which is capable of supplying currents of two different values. The collectors of the transistors 42 and 46 are connected to ground. The base of each transistor 42 is connected to an output 45 of a decoding device, not shown. The bases of the transistors 46 are connected to a voltage source 36. The row section arrangement described is repeated n times in each group.

The bases of the transistors 1 of the same column are connected directly to a column conductor Y, to which the emitters of a read transistor 47 and of a reference transistor 48 are connected. Each column is supplied from a current source 49, which supplies a constant current. The collectors of the transistors 48 are connected to ground and the collectors of the transistors 47 of the same group of m columns are connected to the same read means 10. The bases of the transistors 48 are connected to a voltage source 44. The base of each transistor 47 is connected to an output of a decoding device, not shown. The column arrangement described is repeated m times per group of columns.

In series with each collector of transistor 1 a fuse 41 is included. The fuses in the collectors of the memory position transistors of the same column group are connected to a point 43, which receives either a high voltage for writing or a low voltage for reading.

In the memory of FIG. 4 each group is arranged in a similar manner as the memory of FIG. 2 which consists of one group only. This has the advantage that the quality of the logic signal received by the read elements is improved.

Figure 5:
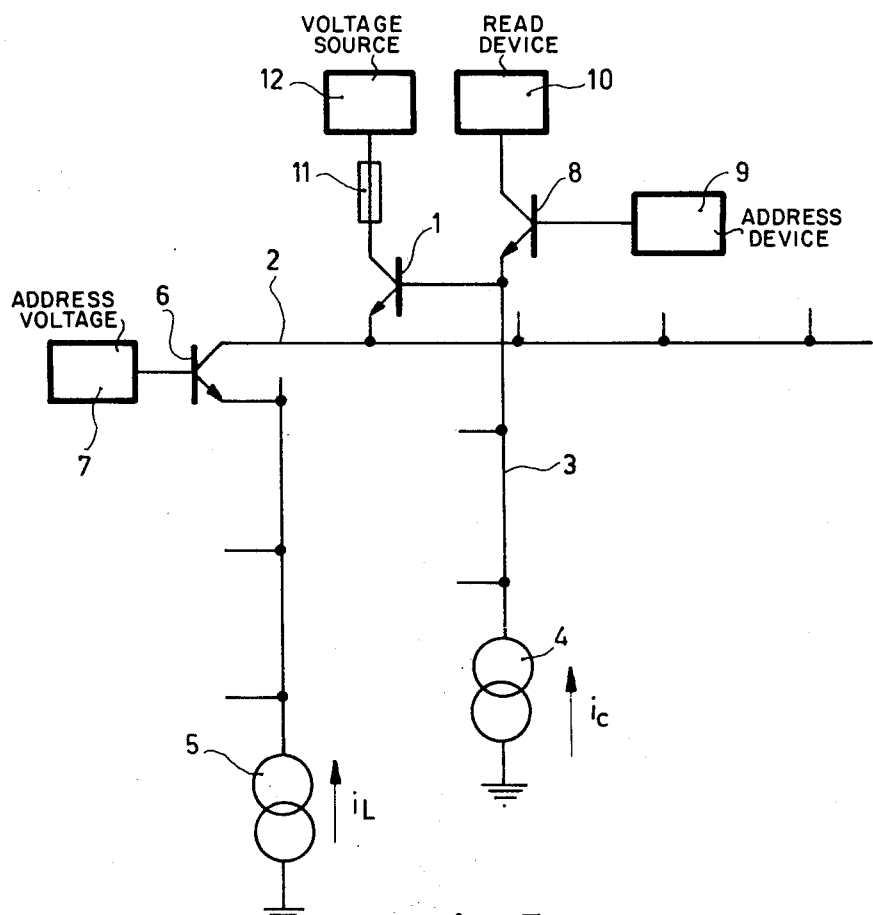
FIG. 5 shows another circuit diagram of a memory according to the invention and in particular relates to an arbitrarily selected memory position.

In FIG. 5 the reference numeral 1 designates a memory position transistor 1 of a matrix arrangement with X × Y identical transistors. The emitter of the memory position transistor 1 is connected to a row conductor 2, to which also the emitters of the other memory position transistors are connected. The base of the transistor 1 is connected to a column conductor 3. The collector of the memory position transistor 1 is connected to a voltage source 12 via a fuse 11, which source can be brought at two different voltage levels. The row conductor 2 is supplied from a current source 5 via an address transistor 6, whose collector is connected to a row conductor. The base of the address transistor 6 receives address voltages from a device 7. The emitter of the transistor 6 receives current from the source 5. The column conductor 3 is supplied from a constant-current source 4. The base of the address transistor 8 receives address voltages from a device 9. The emitter of the transistor 8 is connected to a column conductor 3 and the collector is connected to a read device 10.

The memory is programmed by turning on the memory position transistor and by causing the current source 5 to supply a current whose value suffices to interrupt the fuse if the information in the memory position corresponds to an interrupted fuse.

The memory is read by a turning on a memory transistor of an addressed line with the aid of an address voltage, which is applied to the base of the transistor 8. When the fuse is interrupted, the read device 10 receives a current which equals the sum of the current $I_c$, which is supplied by the current source 4, and the current $I_1$, which is supplied by the current source 5, multiplied by the gain factor $\alpha$ of the transistor 6. Said current consequently equals $I_c + \alpha . I_1$. When the fuse is not interrupted, the read device 10 receives a current which equals the sum of the current supplied by the current source 4 and the base current of the memory transistor 1. The last mentioned current equals $\alpha . I_1$ divided by the gain factor $\beta$ of the last mentioned transistor.

The address voltages are provided to direct the current of the current source 5 to the desired row and to turn on a memory position transistor of said row when the column to which it is connected is addressed and to turn it off when the column to which the transistor is connected is non-addressed.

Figure 6:
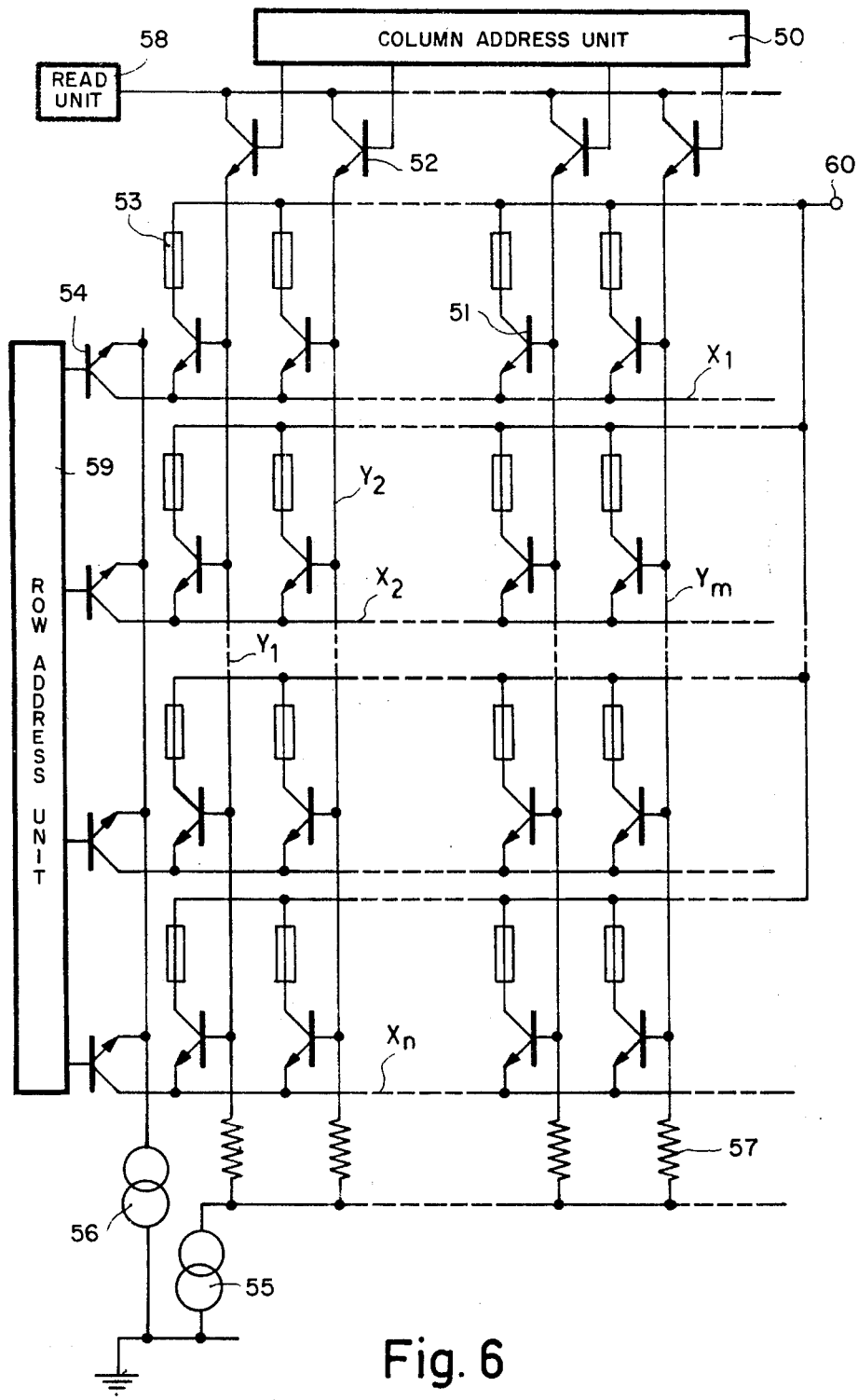
FIG. 6 shows a third embodiment of the memory according to the invention.

The memory of FIG. 6 comprises the memory position transistors 51, which are arranged in the rows X and the columns Y. The emitters of the transistors 51 of the same row are connected directly to a row conductor X, to which the collector of a row address transistor 54 is connected. The emitter of the transistor 54 is connected to a current source 56, which supplies a constant current when said transistor 54 is turned on by a signal at its base via the row address means 59. At the same time, the other row address transistors are cut off. There are n rows of memory-position transistors, which are connected to n conductors, designated $X_1$ to $X_n$.

The bases of the transistors 51 of the same column are connected directly to a column conductor Y, to which the emitter of a read transistor 52 is connected. Each column is supplied from a current source 55 and is connected to the current source 55 via a resistor 57. The collectors of the read transistors 52 are connected to a read device 58, which detects the differences in current intensity received from one of the transistors 52. The bases of the transistors 52 receive the address signals from a column address device 50, which turn on the memory position transistor which is connected to an addressed column and which is located at a row to which the current from the current source 56 is applied. There are m columns of memory-position transistors, which are connected to m conductors designated $Y_1$ to $Y_m$.

In series with each collector of a memory transistor 51 a fuse 53 23 is included. The fuses are connected to a point 60, to which a voltage of either a high value for writing or a voltage of low value for reading can be applied. The memory is programmed by addressing a memory position transistor whose fuse is to be interrupted, and by the current source 56 supplying a current of sufficient intensity and simultaneously bringing the voltage applied to point 60 at a sufficiently high level.

The memory is read by bringing the voltage which is supplied to the point 60 at its low level and addressing the various memory positions.

In a preferred embodiment of a memory in accordance with FIG. 6 in which all transistors are of the npn-type and integrated in a silicon substrate, voltages of approximately the following values are employed. The low and the high level of the address signals which are applied to the bases of the transistors 54 are approximately −2.4 V and −3.2 V. The high and the low level of the signals, which are applied to the bases of the transistors 52 are approximately −0.8 V and −0.6 V. Point 60 has a voltage of 0 V and is brought at +5 V during programming of the memory. The substrate in which the transistors are integrated has the most negative potential, for example −5.2 V. The memory is compatible with the inputs and outputs of logic circuits of the ECL-type.

A memory position is addressed by bringing the base of the relevant row-address transistor at high level, while the other transistor remain at low level. The base of the relevant column read transistor is brought at high level, while the other transistors remain at low level. In the above situation the memory-position transistor will be conductive. The relevant read transistor receives a part of the current which is supplied by the current source 55, plus the base current of the memory-position transistor. The other memory-position transistors of the same column receive no current from the current source 56. The corresponding row-address transistors are not conductive.

What is claimed is:

1. A programmable read-only memory comprising at least one row-column matrix of fusible link memory positions connected to row and column conductors, the columns being arranged in groups, each of said memory positions comprising a bipolar memory transistor, and a fuse connected in series with the collector electrode of said memory transistor, each of the emitters of said memory transistors of a row being connected directly to said respective row conductor, each of the bases of said memory transistors of a column being connected directly to said respective column conductor, and each of the collectors of a group of said memory transistors being connectable to a single voltage source via said respective fuse; column address means; difference detecting means; reading means, including a read transistor whose emitter is connected directly to said corresponding column conductor, whose base is connected to said corresponding column address means, and whose collector is connected to said difference detecting means; and a row-address transistor and row-address means, for each row, wherein each of said row conductors is connected to the emitter of said row-address transistor, the base of said row-address transistor being connected to said row-address means.

2. A memory as defined in the claim 1 further comprising means for supplying to each said row conductor a current pulse of sufficient power to blow a corresponding one of said fuses and means for bringing the voltage at said corresponding fuse to a high level for at least the duration of said pulse.

3. A memory as defined in claim 1 wherein said fuses are composed of localized layers of nickel-chromium.

4. A memory as defined in claim 1 further comprising a reference voltage transistor connected as a differential pair with each said read transistor, the emitter of said reference voltage transistor being connected directly to said corresponding column conductor and its base being connectable to a constant-voltage source 5. A memory as defined in claim 4 further comprising a voltage limiting transistor connected as a differential pair with each said row-address transistor and said memory transistor of a particular row, the emitter being connected directly to said row conductor and base of said voltage limiting transistor being connectable to a constant-voltage source.

6. A memory as defined in claim 1 wherein said memory transistors are npn-transistors.

7. A memory as defined in claim 6 wherein said memory is integrated on one silicon substrate chip.

8. A memory as defined in claim 7 wherein the emitters of said memory transistors are formed by diffusion.

* * * * *